United States Patent
Chiou et al.

(10) Patent No.: US 8,647,925 B2
(45) Date of Patent: Feb. 11, 2014

(54) SURFACE MODIFICATION FOR HANDLING WAFER THINNING PROCESS

(75) Inventors: Wen-Chih Chiou, Miaoli (TW); Shau-Lin Shue, Hsinchu (TW); Weng-Jin Wu, Hsinchu (TW); Ju-Pin Hung, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 259 days.

(21) Appl. No.: 12/792,975

(22) Filed: Jun. 3, 2010

(65) Prior Publication Data

US 2011/0081749 A1    Apr. 7, 2011

Related U.S. Application Data

(60) Provisional application No. 61/247,739, filed on Oct. 1, 2009.

(51) Int. Cl.
*H01L 21/00* (2006.01)

(52) U.S. Cl.
USPC ......................................................... 438/109

(58) Field of Classification Search
USPC .......................................................... 438/109
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,642,081 B1 * | 11/2003 | Patti ........................... 438/109 |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |

(Continued)

OTHER PUBLICATIONS

Katoh, Kohji, et al., "Study on Adhesion Improvement of Polymide Film", Journal of Photopolymer Science and Technology, vol. 22, No. 3, 2009, pp. 393-396.

(Continued)

*Primary Examiner* — Jenny L Wagner
(74) *Attorney, Agent, or Firm* — Lowe Hauptman & Ham, LLP

(57) ABSTRACT

A wafer is provided with a through via extending a portion of a substrate, an interconnect structure electrically connecting the through via, and a polyimide layer formed on the interconnect structure. Surface modification of the polyimide layer is the formation of a thin dielectric film on the polyimide layer by coating, plasma treatment, chemical treatment, or deposition methods. The thin dielectric film is adhered strongly to the polyimide layer, which can reduce the adhesion between the wafer surface and an adhesive layer formed in subsequent carrier attaching process.

20 Claims, 5 Drawing Sheets

(56) References Cited

U.S. PATENT DOCUMENTS

| | | |
|---|---|---|
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2010/0090318 A1 | 4/2010 | Hsu et al. |
| 2010/0090319 A1 | 4/2010 | Hsu et al. |

OTHER PUBLICATIONS

Chinese Application No. 2012083000696850 corresponding to U.S. Appl. No. 12/792,975, Sep. 4, 2012.

* cited by examiner

SURFACE MODIFICATION FOR HANDLING WAFER THINNING PROCESS

CROSS-REFERENCE TO RELATED APPLICATIONS

The present application claims priority of U.S. Provisional Patent Application Ser. No. 61/247,739, filed on Oct. 1, 2009, which is incorporated herein by reference in its entirety.

TECHNICAL FIELD

This disclosure relates to the fabrication of integrated circuits, and more particularly, to a method of handling a wafer thinning process.

BACKGROUND

Three-dimensional (3D) wafer-to-wafer, die-to-wafer or die-to-die vertical stack technology seeks to achieve the long-awaited goal of vertically stacking many layers of active IC devices such as processors, programmable devices and memory devices to shorten average wire lengths, thereby reducing interconnect RC delay and increasing system performance. One major challenge of 3D interconnects on a single wafer or in a die-to-wafer vertical stack is through-silicon via (TSV) that provides a signal path for signals to traverse from one side of the wafer to the other. TSV is typically fabricated to provide the through-silicon via filled with a conducting material that passes completely through the layer to contact and connect with the other TSVs and conductors of the bonded layers.

In order to reduce the thickness of semiconductor packages, increase the chip speed, and for high-density fabrication, efforts to reduce the thickness of a semiconductor wafer are in progress. Thickness reduction is performed by so-called backside grinding of a semiconductor wafer on the surface opposite that containing pattern-formed circuitry, on which a temporary carrier is typically attached to support wafer handling through a glue layer during wafer thinning and subsequent processes. Currently, carrier technology faces tough challenge in bonding uniformity and high risk in de-bonding process while thickness of stacked wafer becoming thinner and thinner.

Polyimide (PI) has been widely used for stress buffer layer application on semiconductor devices because of its excellent thermal, mechanical and insulating properties as well as easy processing capabilities. As the PI layer is used at the final stage of the front-end process, compatibility with various organic and/or inorganic materials is important. In particular, PI adhesion has often been discussed in relation to device failure. For example, in some occasions, it fails to remove the glue layer from the PI layer in detaching the carrier from the wafer since the adhesion strength between the PI layer and the glue layer is strong, especially after thermal cycles. A conventional approach uses $N_2$ plasma treatment to enhance adhesion between PI and underfill. Adversely, it increases the PI surface roughness and produces the covalent bond with the glue layer because of an amide or amine group generated on the PI layer.

DETAILED DESCRIPTION OF ILLUSTRATIVE EMBODIMENTS

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIG. 1A to FIG. 1G illustrate an exemplary embodiment of manufacturing vertically stacked devices.

Figure 1A:
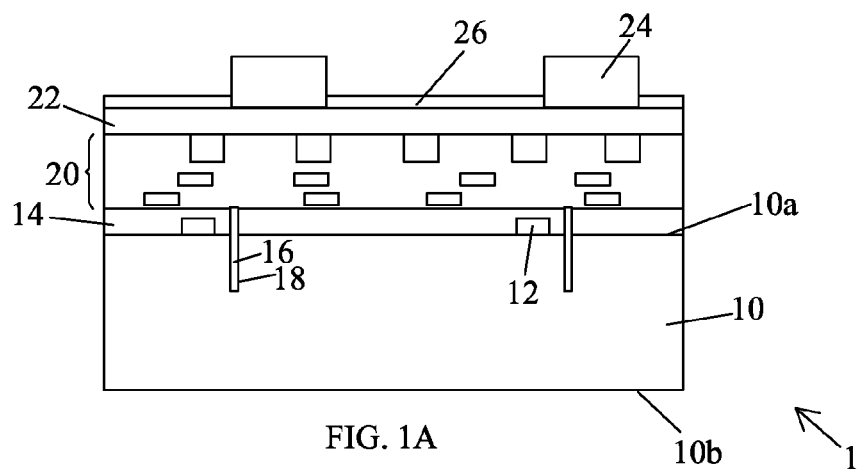
FIG. 1A to FIG. 1G are cross-sectional diagrams depicting an exemplary embodiment of manufacturing vertically stacked devices.

Referring to FIG. 1A, a wafer 1, which includes a substrate 10, is provided. In some embodiments, a substrate 10 may include a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 has a first surface 10a and a second surface 10b opposite to the first surface 10a. The first surface 10a may be referred to as the frontside on which integrated circuits including active or passive devices such as transistors, resistors, capacitors, diodes, inductors, or the like. These active or passive devices are electrically coupled to bond pads and/or other interconnection structures. The circuitry may be any type of circuitry suitable for a particular application. For example, the circuitry may include various N-type metal-oxide semiconductor (NMOS) and/or P-type metal-oxide semiconductor (PMOS) devices. The functions may include memory structures, processing structures, sensors, amplifiers, power distribution, input/output circuitry, or the like. As depicted, devices 12 may be formed on the first surface 10a of the substrate 10. The second surface 10b may be referred to as the backside, which will be thinned down and processed to form bond pads and/or other interconnection structures thereon.

A first dielectric layer 14 is formed on the first surface 10a, in which contacts are formed to electrically connect the devices 12 respectively. Generally, the first dielectric layer 14 may be formed, for example, of a low dielectric constant (low-k) dielectric material, silicon oxide, phosphosilicate glass (PSG), borophosphosilicate glass (BPSG), fluorinated silicate glass (FSG), or the like, by any suitable method. For example, the first dielectric layer 14 includes an oxide layer that may be formed by chemical vapor deposition (CVD) techniques using tetra-ethyl-ortho-silicate (TEOS) and oxygen as a precursor. Other materials and processes may be used. It should also be noted that the first dielectric layer 14 may comprise a plurality of dielectric layers, with or without an etch stop layer formed between dielectric layers.

FIG. 1A also depicts a plurality of through vias 16 passing through at least a part of the substrate 10. The through via 16 is a conductor-filled plug extending from the first surface 10a toward the second surface 10b and reaching an intended depth. Also, in some embodiments, an isolation layer 18 is formed on the sidewalls and bottom of the though via 16, and electrically insulates the though via 16 from the substrate 10. The fabrication of the through vias 16 is performed before the fabrication of "first-level interconnection" which refers to a lowermost metal layer patterned in a lowermost inter-metal dielectric (IMD) layer overlying contact structures and active or passive devices 12. In an embodiment, after the contact formation, a trench is formed to pass through the first dielectric layer 14 and extend to a portion of the substrate 10, and then lined with an isolation material and filled with a conductive material followed by a planarization process. The through vias 16 may be formed of any suitable conductive material, but are preferably formed of a highly-conductive, low-resistive metal, elemental metal, transition metal, or the like. In an embodiment, the though via 16 is a trench filled with a conductive layer formed of Cu, W, Cu alloy, or the like. A conductive barrier layer formed of Ti, TiN, Ta, TaN or combinations thereof may be formed in the trench surrounding the conductive layer. The isolation layer 18 may be formed of commonly used dielectric materials such as silicon nitride, silicon oxide (for example, tetra-ethyl-ortho-silicate (TEOS) oxide), or the like.

A first interconnect structure 20, which includes inter-layer dielectric layers and a metallization structure, is formed overlying the integrated circuits, the first dielectric layer 14, and the through vias 16. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. The metallization structure includes metal lines and vias, which may be formed of copper or copper alloys, and may be formed using damascene processes. One skilled in the art will realize the formation details of the metallization layers. A passivation layer 22 is formed over first interconnect structure 20. In some embodiments, the passivation layer 22 may be formed of materials such as silicon oxide, silicon nitride, un-doped silicate glass (USG), polyimide, and/or multi-layers thereof.

A metal pad is formed on the passivation layer 22. In some embodiments, the metal pad may be formed of aluminum, copper, silver, gold, nickel, tungsten, alloys thereof, and/or multi-layers thereof. The metal pad may be electrically connected to the devices 12 and the through via 16, for example, through underlying first interconnection structure 20. A dielectric buffer layer 26 is formed on the metal pad and patterned to provide a bump formation window. A bump structure 24 is then formed overlying and electrically connected to the metal pad, protruding from the dielectric buffer layer 26. In some embodiments, the dielectric buffer layer 26 may be formed of a polymer, such as an epoxy, polyimide, benzocyclobutene (BCB), polybenzoxazole (PBO), or the like, although other relatively soft, often organic, dielectric materials can also be used. In one embodiment, the polymer layer is a polyimide layer. The polymer layer is soft, and hence has the function of reducing inherent stresses on respective substrate. In addition, the dielectric buffer layer can easily be formed to thickness of tens of microns.

The bump structure 24 refers to the structure including an under-bump-metallurgy (UBM) layer and a bump on the UBM layer. The UBM layer includes a diffusion barrier layer and/or a seed layer. The diffusion barrier layer, also referred to as a glue layer, may be formed of tantalum nitride, although it may also be formed of other materials such as titanium nitride, tantalum, titanium, titanium nitride, or the like, using physical vapor deposition (PVD) or sputtering. The seed layer may be formed of copper, or copper alloys including silver, chromium, nickel, tin, gold, or combinations thereof, using PVD or sputtering. The bump may include a copper layer and a cap layer covering the top and/or the sidewalls of the copper layer. The copper layer may be a thin copper layer of about 3-10 μm thickness or a thick copper layer of about 40-70 μm thickness. The cap layer may include a barrier layer, a solder layer or combinations thereof. The barrier layer may include nickel, gold (Au), silver, palladium (Pd), indium (In), nickel-palladium-gold (NiPdAu), nickel-gold (NiAu) or other similar materials or alloy. The solder layer may be made of Sn, SnAg, Sn—Pb, SnAgCu, SnAgZn, SnZn, SnBi—In, Sn—In, Sn—Au, SnPb, SnCu, SnZnIn, or SnAgSb, etc. In some embodiments, post-passivation interconnect (PPI) line may be formed under the bump structure 24 and over the passivation layer 22. The PPI line may include, but not limited to, for example copper, aluminum, tungsten, silver, copper alloy, or other mobile conductive materials. The PPI line may further include a nickel-containing layer (not shown) on the top a copper-containing layer. The PPI line connects the metal pad to the bump structure 24. The PPI line may also function as power lines, re-distribution lines (RDL), inductors, capacitors or any passive components.

Figure 1B:
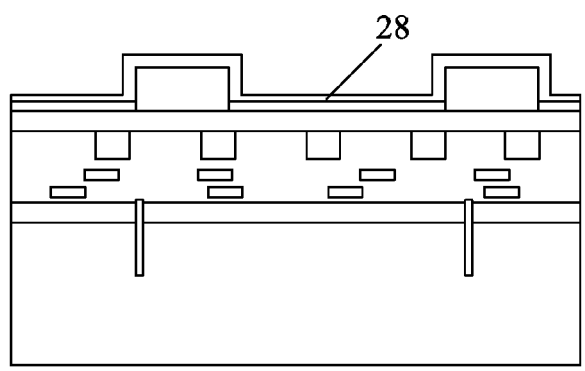

Referring to FIG. 1B, surface modification of the dielectric buffer layer 26 is performed by forming a thin dielectric film 28 on the surface of the wafer 1, including the surface of the dielectric buffer layer 26 and the surface of the bump structure 24, for example by coating, plasma treatment, chemical treatment, or deposition methods. The thin dielectric film 28 may include a thin oxide film, a thin nitride film or combinations thereof. In an embodiment of forming a polyimide layer as the dielectric buffer layer 26, the thin dielectric film 28 is also referred to as a polyimide surface modification film 28. The thin dielectric film 28 has a thickness about 0.3 μm. For example, an LPCVD or PECVD process using gaseous mixture of tetraethylorthosilicate (TEOS) and $O_2$ for the thin oxide film deposition, or using gaseous mixture of $SiH_4$, $NH_3$, and $N_2$ for the thin nitride film deposition. The thin dielectric film 28 used at the final stage of the front-end process is adhered strongly to the dielectric buffer layer 26, which can reduce the adhesion between the wafer surface and a glue layer formed in subsequent carrier attaching process, so that the adhesive layer and the carrier will be easily detached from the wafer. There is no need to create more kinds of glue materials for fitting different wafer surfaces.

Figure 1C:
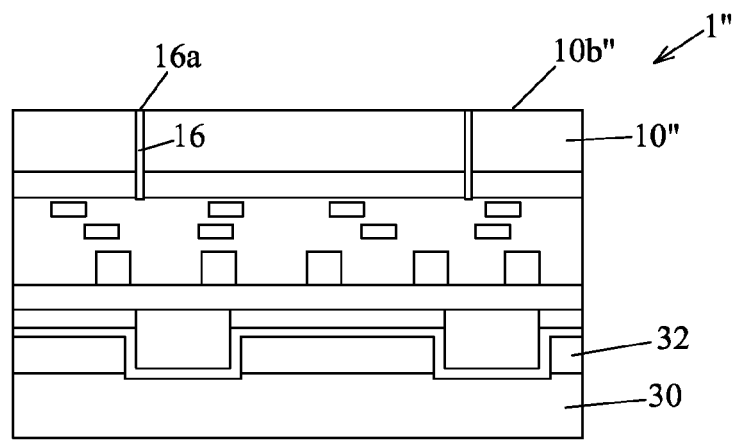

In FIG. 1C, the wafer 1 is attached to a carrier 30 through an adhesive layer 32 and then the bonded structure is flipped. The carrier 30 provides protection for the various features formed on the substrate 10, and also provides mechanical strength and support for subsequent processes. In some embodiments, the carrier 30 may comprise any suitable material, such as silicon wafer and/or glass. The adhesive layer 32 may fill the gap between the carrier 30 and the wafer 1, so that the adhesive layer 32 may provide maximum protection to the structure inside the wafer 1 in subsequent backside grinding and interconnect formation process. Since the bonded structure is flipped, a thinning process e.g., grinding and/or etching is then performed on the second surface 10b to remove a portion of the substrate 10 to the desired final thickness, resulting in a thinned substrate 10" with a predetermined thickness depending on the purpose for which the semiconductor package is used. One of ordinary skill in the art will realize that other thinning processes, such as a polish process (including a wet polish (CMP) and a dry polish), a plasma etch process, a wet etch process, or the like, may also be used. In an embodiment, the end 16a of the through via 16 is exposed and/or protruded from the second surface 10b" of the thinned substrate 10" after the thinning process.

Figure 1D:
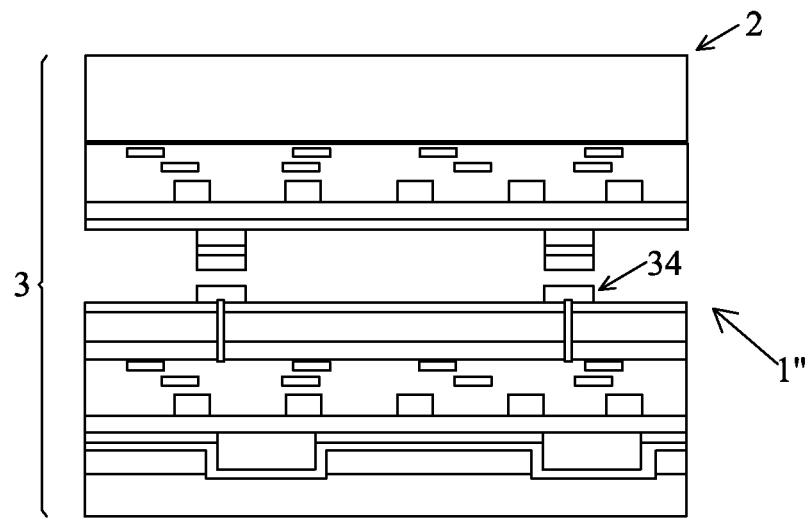

Then, referring to FIG. 1D, processing of the second surface 10b" of the thinned substrate 10" is performed to form a second interconnect structure 34 electrically connected to the through via 16. For an example, the second interconnect structure 34 includes electrical connections and/or other structures (e.g., redistribution layers, pads, solder bumps or copper bumps) are formed over the surface 10b" of the thinned wafer 10". The details of the backside grinding and the interconnect structure formation is provided in the co-pending U.S. patent applications: application Ser. No. 12/332,934, entitled "Backside Connection to TSVs Having Redistribution Lines;" and application Ser. No. 12/347,742, entitled "Bond Pad Connection to Redistribution Lines Having Tapered Profiles;" which applications are hereby incorporated herein by reference. The details are thus not repeated herein. Next, dies 2 are bonded onto the thinned wafer 10" through the second interconnect structure 34, forming a dies-to-wafer stack 3, wherein the bonding methods include commonly used methods such as oxide-to-oxide bonding, oxide-to-silicon bonding, copper-to-copper bonding, adhesive bonding, or the like. The dies 2 may be memory chips, RF (radio frequency) chips, logic chips, or other chips. The die 2 has a first surface and a second surface, and integrated circuits are formed on the first surface. In one embodiment, the first surface of the die 2 is bonded onto the thinned wafer 10". In one embodiment, the second surface of the die 2 is bonded onto the thinned wafer 10".

Figure 1E:
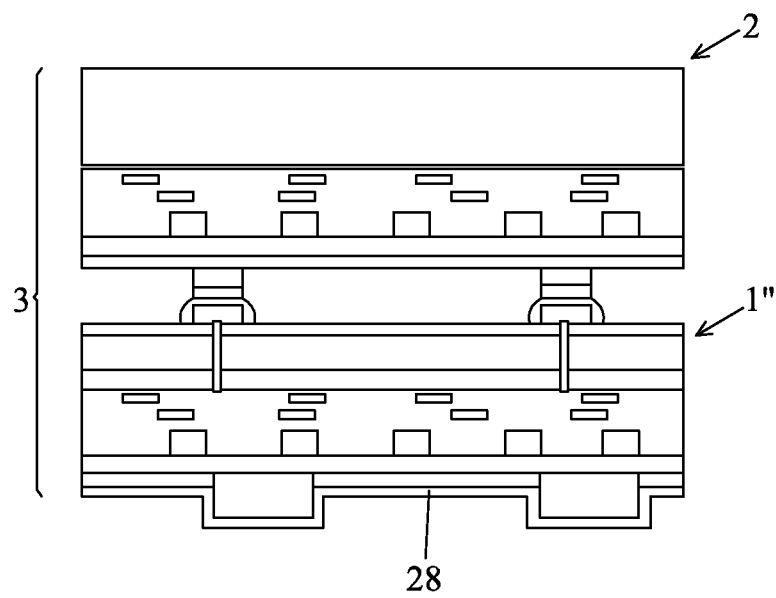
Figure 1F:
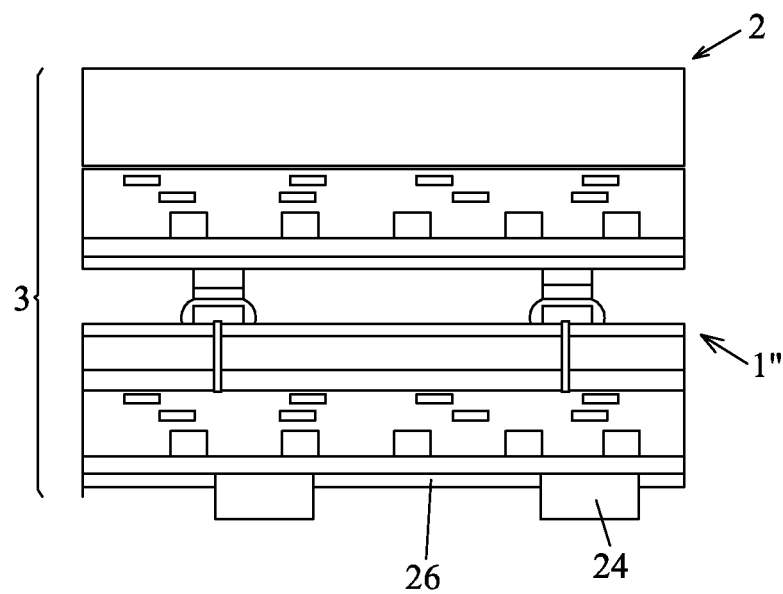

Thereafter, as depicted in FIG. 1E, the carrier 30 is detached from the thinned wafer 1", followed by the removal of the adhesive layer 32. Thus, the thin dielectric film 28 is exposed. The detaching process is performed for example by using a solvent, by suing UV irradiation or by being pulled off. Since the thin dielectric film 28 reduces the adhesion strength between the adhesive layer 32 and the thinned wafer 1", it becomes easier to remove the adhesive layer 32 and the carrier 30. In FIG. 1F, the thin dielectric film 28 is then removed by diluted hydrogen fluoride (DHF) to restore the surface of the dielectric buffer layer 26 (e.g., polyimide) to high adhesion strength with the underfill (e.g., epoxy) in subsequent assembly process.

Figure 1G:
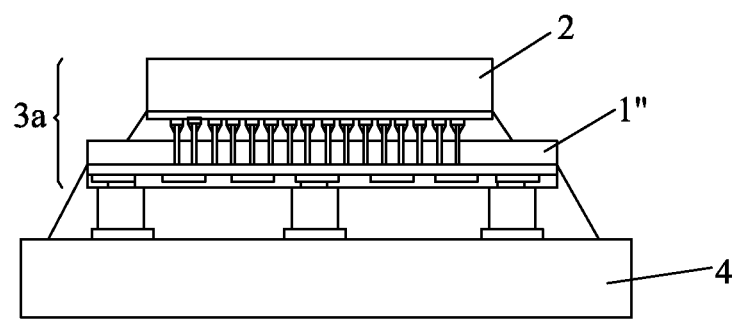

Referring to FIG. 1G, the dies-to-wafer stack 3 is sawed along cutting lines to separate the dies-to-wafer stack into individual IC stacks 3a, and then packaged onto a package substrate 4 with solder bumps or Cu bumps mounted on a pad on the package substrate 4. In some embodiments, the package substrate is replaced by another die.

Cross-sectional diagrams of FIG. 2A to FIG. 2E illustrate an exemplary embodiment of manufacturing vertically stacked devices. Explanation of the same or similar portions to the description in FIG. 1A to FIG. 1G is omitted herein.

Figure 2A:
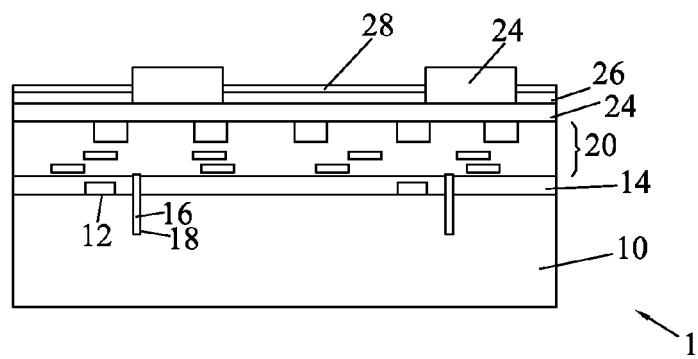
FIG. 2A to FIG. 2E are cross-sectional diagrams depicting an exemplary embodiment of manufacturing vertically stacked devices.

Referring to FIG. 2A, surface modification of the dielectric buffer layer 26 is performed by forming a thin dielectric film 28 on the surface of the dielectric buffer layer 26, for example by coating, plasma treatment, chemical treatment, or deposition methods. The thin dielectric film 28 may include a thin oxide film, a thin nitride film or combinations thereof. Next, the bump structure 24 is formed in and protruding from the thin dielectric film 28. The thin dielectric film 28 used as the top-level passivation layer is adhered strongly to the dielectric buffer layer 26, which can reduce the adhesion between the wafer surface and a glue layer formed in subsequent carrier attaching process, so that the glue layer and the carrier will be easily detached from the wafer. There is no need to create more kinds of glue materials for fitting different wafer surfaces.

Figure 2B:
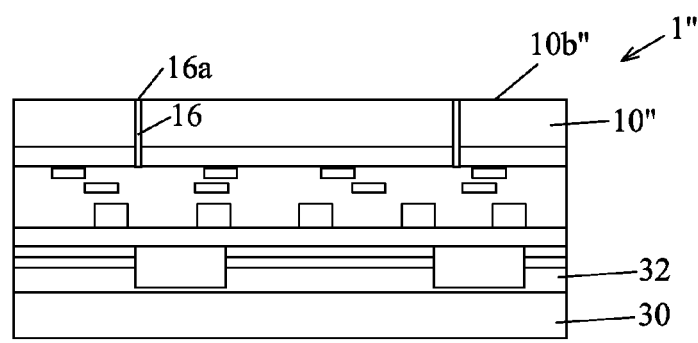
Figure 2C:
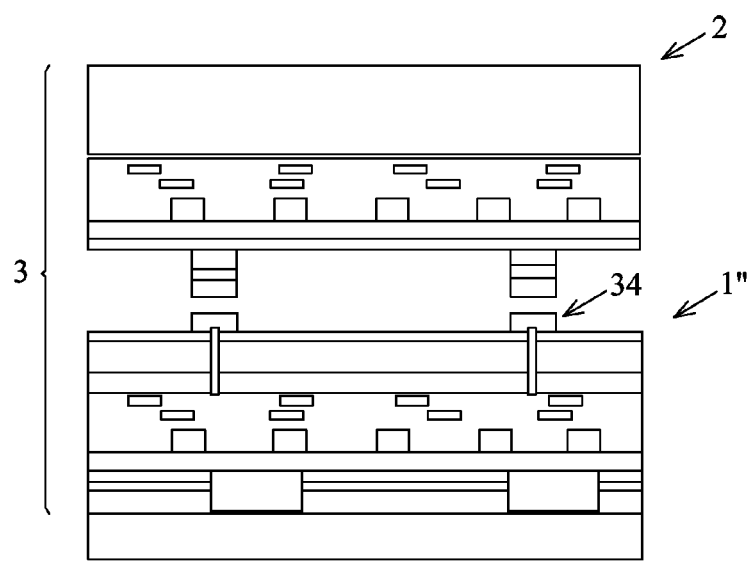
Figure 2D:
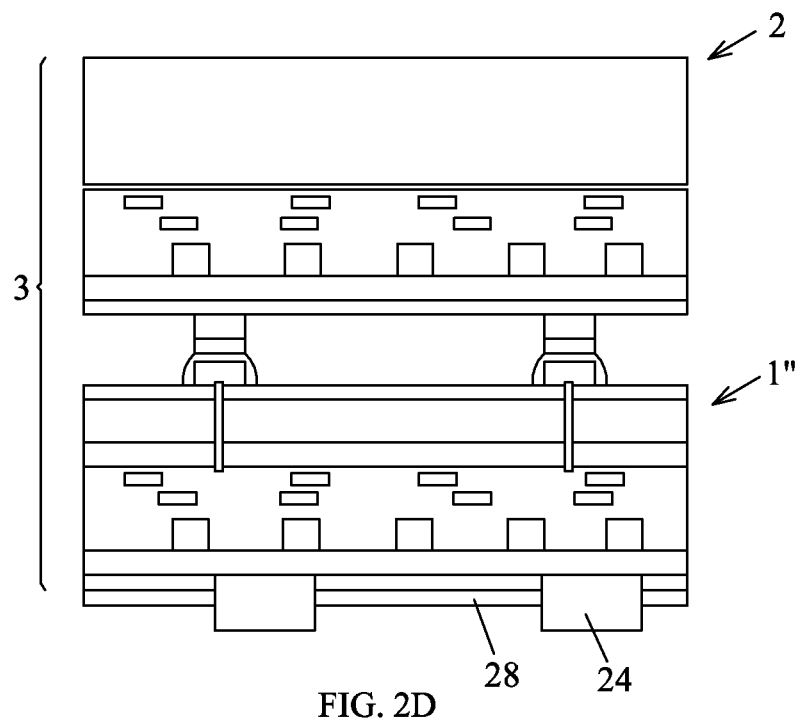
Figure 2E:
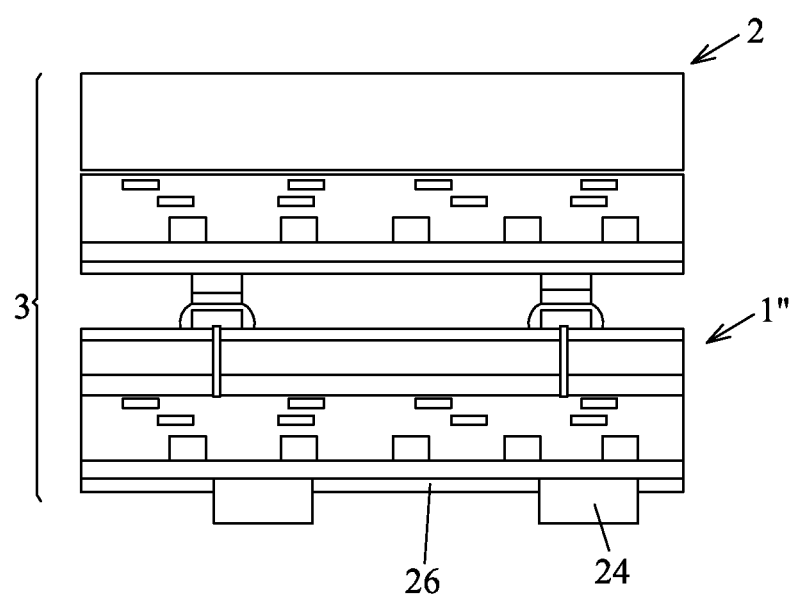

In FIG. 2B, the wafer 1 is attached to a carrier 30 through an adhesive layer 32 and then the bonded structure is flipped to perform a thinning process on the second surface 10b, resulting in a thinned substrate 10" with a predetermined thickness depending on the purpose for which the semiconductor package is used. In an embodiment, the end 16a of the through via 16 is exposed and/or protruded from the second surface 10b" of the thinned substrate 10" after the thinning process. After the formation of a second interconnect structure 34 on the second surface 10b, dies 2 are bonded onto the thinned wafer 1", forming a dies-to-wafer stack 3 as depicted in FIG. 2C. Thereafter, as depicted in FIG. 2D, the carrier 30 is detached from the thinned wafer 1", followed by the removal of the adhesive layer 32. Thus, the thin dielectric film 28 is exposed. Since the thin dielectric film 28 reduces the adhesion strength between the adhesive layer 32 and the thinned wafer 1", it becomes easier to remove the adhesive layer 32 and the carrier 30. In FIG. 2E, the thin dielectric film 28 is then optionally removed by diluted hydrogen fluoride (DHF). The dies-to-wafer stack 3 will be sawed into individual IC stacks, and then packaged onto a package substrate.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. A method, comprising:
   providing a semiconductor substrate having a first surface and a second surface;
   forming a through via extending into the semiconductor substrate from the first surface toward the second surface;
   forming a first interconnect structure overlying the first surface of the semiconductor substrate and being electrically connected to the through via;
   forming a dielectric buffer layer overlying the first interconnect structure;
   forming a dielectric film on the dielectric buffer layer; and
   attaching a carrier to the dielectric film of the semiconductor substrate by using an adhesive layer sandwiched between the carrier and the dielectric film.

2. The method of claim 1, wherein the dielectric buffer layer comprises a polymer layer.

3. The method of claim 1, wherein the dielectric buffer layer comprises a polyimide layer.

4. The method of claim 1, wherein the dielectric film comprises a silicon oxide layer.

5. The method of claim 1, wherein the dielectric film comprises a silicon nitride layer.

6. The method of claim 1, further comprising forming a bump structure overlying the dielectric buffer layer, wherein the dielectric film is formed on a surface of the bump structure.

7. The method of claim 1, further comprising performing a thinning process on the second surface of the semiconductor substrate to expose the through via.

8. The method of claim 7, further comprising forming a second interconnect structure overlying the second surface of the semiconductor substrate and being electrically connected the through via after performing the thinning process.

9. The method of claim 8, further comprising bonding a die onto the second surface of the semiconductor substrate after forming the second interconnect structure.

10. The method of claim 9, further comprising removing the carrier from the semiconductor substrate.

11. The method of claim 10, further comprising removing the dielectric film from the dielectric buffer layer.

12. A method, comprising:
 providing a wafer comprising a semiconductor substrate having a first surface and a second surface;
 forming a through via extending into a portion of the semiconductor substrate from the first surface of the semiconductor substrate toward the second surface of the semiconductor substrate;
 forming a first interconnect structure overlying the first surface of the semiconductor substrate and being electrically connected to the through via;
 forming a polyimide layer overlying the first interconnect structure;
 forming a bump structure over the first interconnect structure and protruding from the polyimide layer; and
 forming a polyimide surface modification film deposited on and covering the polyimide layer and the bump structure.

13. The method of claim 12, further comprising attaching a carrier on the polyimide surface modification film of the semiconductor substrate by using the adhesive layer.

14. The method of claim 12, wherein forming a polyimide surface modification film comprises forming a dielectric film on the polyimide layer.

15. The method of claim 12, wherein forming a polyimide surface modification film comprises forming a dielectric film by coating, plasma treatment, chemical treatment, or deposition methods.

16. The method of claim 13, further comprising performing a thinning process on the second surface of the semiconductor substrate to expose the through via.

17. The method of claim 16, further comprising forming a second interconnect structure overlying the second surface of the semiconductor substrate and being electrically connected to the through via after performing the thinning process.

18. The method of claim 17, further comprising bonding a die onto the second surface of the semiconductor substrate after forming the second interconnect structure.

19. The method of claim 18, further comprising removing the carrier from the semiconductor substrate.

20. The method of claim 13, further comprising removing the carrier from the semiconductor substrate.

* * * * *